(12) United States Patent
Rahimo et al.

(10) Patent No.: US 9,000,480 B2
(45) Date of Patent: Apr. 7, 2015

(54) REVERSE-CONDUCTING SEMICONDUCTOR DEVICE

(71) Applicant: ABB Technology AG, Zürich (CH)

(72) Inventors: Munaf Rahimo, Uezwil (CH);
Wolfgang Janisch, Unterkulm (CH);
Eustachio Faggiano, Wohlen (CH)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 13/861,074

(22) Filed: Apr. 11, 2013

(65) Prior Publication Data

US 2013/0228823 A1 Sep. 5, 2013

Related U.S. Application Data

(62) Division of application No. 12/819,646, filed as application No. PCT/EP2008/067848 on Dec. 18, 2008, now Pat. No. 8,435,863.

(51) Int. Cl.
*H01L 29/66* (2006.01)
*H01L 27/06* (2006.01)
(Continued)

(52) U.S. Cl.
CPC ........ *H01L 27/0664* (2013.01); *H01L 29/0834* (2013.01); *H01L 29/41708* (2013.01); *H01L 29/66333* (2013.01); *H01L 29/7395* (2013.01)

(58) Field of Classification Search
CPC .............. H01L 29/1095; H01L 29/41766;
H01L 29/7397; H01L 29/7813; H01L
29/1608; H01L 29/7802; H01L 2924/00;
H01L 2924/0002; H01L 2224/48247; H01L
29/7395; H01L 2224/45015

USPC .......................... 257/140, E21.696, E27.017
See application file for complete search history.

(56) References Cited

U.S. PATENT DOCUMENTS 6,054,748 A 4/2000 Tsukuda et al.
7,405,452 B2 7/2008 Yilmaz
(Continued)

FOREIGN PATENT DOCUMENTS

DE 39 17 769 A1 12/1990
DE 198 11 568 A1 9/1998
JP 2005-101514 A 4/2005

OTHER PUBLICATIONS

International Search Report dated Apr. 1, 2009.
(Continued)

*Primary Examiner* — Tony Tran
(74) *Attorney, Agent, or Firm* — Buchanan Ingersoll & Rooney PC

(57) ABSTRACT

A reverse-conducting semiconductor device (RC-IGBT) including a freewheeling diode and an insulated gate bipolar transistor (IGBT), and a method for making the RC-IGBT are provided. A first layer of a first conductivity type is created on a collector side before a second layer of a second conductivity type is created on the collector side. An electrical contact in direct electrical contact with the first and second layers is created on the collector side. A shadow mask is applied on the collector side, and a third layer of the first conductivity type is created through the shadow mask. At least one electrically conductive island, which is part of a second electrical contact in the finalized RC-IGBT, is created through the shadow mask. The island is used as a mask for creating the second layer, and those parts of the third layer which are covered by the island form the second layer.

4 Claims, 13 Drawing Sheets

(51) Int. Cl.
*H01L 29/08* (2006.01)
*H01L 29/417* (2006.01)
*H01L 29/739* (2006.01)

(56) References Cited

U.S. PATENT DOCUMENTS

| | | |
|---|---|---|
| 8,008,711 B2 | 8/2011 | Takahashi |
| 8,052,854 B1 | 11/2011 | Hunter et al. |
| 2005/0017290 A1 | 1/2005 | Takahashi et al. |
| 2005/0045960 A1 | 3/2005 | Takahashi |
| 2005/0156283 A1* | 7/2005 | Tokuda et al. ............ 257/622 |

OTHER PUBLICATIONS

Written Opinion of the International Searching Authority dated Apr. 1, 2009.
European Search Report dated Jun. 9, 2008.
First Office Action issued in Chinese Patent Application No. 200880127360.0 on Nov. 23, 2011, and English translation thereof.
English language Translation of the First Office Action issued May 14, 2013, by the Japanese Patent Office in corresponding Japanese Patent Application No. 2010-538721. (3 pages).

* cited by examiner

REVERSE-CONDUCTING SEMICONDUCTOR DEVICE

RELATED APPLICATIONS

This application claims priority as a divisional application under 35 U.S.C. §120 to Ser. No. 12/819,646, which was filed on Jun. 21, 2010 which is a continuation application under 35 U.S.C. §120 to PCT/EP2008/067848, which was filed as an International Application on Dec. 18, 2008 designating the U.S., and which claims priority to European Application 07150165.4 filed in Europe on Dec. 19, 2007. The entire contents of these applications are hereby incorporated by reference in their entireties.

FIELD

The present disclosure relates to power electronics. More particularly, the present disclosure to a method of manufacturing a reverse-conducting semiconductor device, to a reverse-conducting semiconductor device, and to a converter with such a reverse-conducting semiconductor device.

BACKGROUND INFORMATION

US Patent Application Publication No. 2005/0017290 discloses a reverse-conducting semiconductor device, which is also called a reverse-conducting insulated gate bipolar transistor 10 (RC-IGBT). The RC-IGBT 10 includes, within one wafer, an insulated gate bipolar transistor (IGBT) with a built-in freewheeling diode. As shown in FIG. 1, the RC-IGBT 10 includes a base layer 1 formed as an n-type base layer with a emitter side 101 and a collector side 102 opposite the emitter side 101. A fourth p-type layer 4 is arranged on the emitter side 101. A fifth n-type layer 5 is arranged on the fourth layer. The fifth layer 5 has a higher doping than the base layer 1 is arranged on the emitter side 101.

A sixth electrically insulating layer 6 is arranged on the emitter side 101. The sixth layer 6 covers the fourth layer 4 and the base layer 1, and partially covers the fifth layer 5. An electrically conductive seventh layer 7 is completely embedded in the sixth layer 6. No portion of the fifth or sixth layer 5, 6 is arranged above the central part of the fourth layer 4.

A first electrical contact 8 is arranged on the central part of the fourth layer 4. The first electrical contact 8 covers the sixth layer 6. The first electrical contact 8 is in direct electrical contact with the fifth layer 5 and the fourth layer 4, but is electrically insulated from the seventh layer 7.

On the collector side 102, a buffer layer 13 is arranged on the base layer 1. On the buffer layer 13, n-type third layers 3 and p-type second layers 2 are arranged alternately in a plane. The third layers 3 and the buffer layer 13 have a higher doping than the base layer 1. The third layers 3 are arranged directly below the fourth layer 4 and the first electrical contact 8 if seen in an orthographic projection.

A second electrical contact 9 is arranged on the collector side 102. The second electrical contact 9 covers the second and third layers 2, 3 and is in direct electrical contact with the second and third layers 2, 3.

In such a reverse-conducting semiconductor device 10, a freewheeling diode is formed between the second electrical contact 9, part of which forms a cathode electrode in the diode, the third layer 3, which forms a cathode region in the diode, the base layer 1, part of which forms a base layer in the diode, the fourth layer 4, part of which forms an anode region in the diode, and the first electrical contact 8, which forms an anode in the diode.

An IGBT is formed between the second electrical contact 9, part of which forms a collector electrode in the IGBT, the second layer 2, which forms a collector region in the IGBT, the base layer 1, part of which forms a base layer, the fourth layer 4, part of which forms a p-base region in the IGBT, the fifth layer 5, which forms a source region in the IGBT, and the first electrical contact 8, which forms an emitter electrode. During an on-state of the IGBT, a channel is formed between the emitter electrode, the source region and the p-base region towards the n-base layer.

The layers of the RC-IGBT on the collector side 102 can be manufactured by implanting and diffusing p-type ions. Afterwards, a resist mask, which is attached to the wafer, is introduced, through which n-type ions are implanted and afterwards diffused. The implantation dose of the n-type ions has to be so high that it compensates the p-type region. The p- and n-type implantation steps can also be reversed.

DE 198 11 568 discloses an IGBT and a manufacturing method for such an IGBT with a built-in MOSFET, which includes on the backside an alternating p-doped third layer and an n-doped second layer. These layers are arranged in different, not overlapping planes. A p-doped third layer is formed, and recesses are formed in the third layer by etching. N-type ions are then implanted over the whole backside surface, and afterwards a heat treatment is performed, by which the n- and p-type layers are created. Therefore, the n-type ions are also implanted on those parts, on which p-type ions are arranged, which implies that the p-dose has to be higher than the n-dose.

In another manufacturing method described in DE 198 11 568, recesses are first created, then the second main side is irradiated in those parts without recess with electrons or protons, and afterwards phosphorous ion implantation is performed over the whole surface. Then p doped ions are implanted into that part without recesses, so that again the dose of the p-type ions has to be higher than the n dose. A heat treatment is performed for forming the n-type second layer and p-type third layer.

Due to the necessary overcompensation, limited selection for dose and depth of the latter manufactured layer of the second and third layers 2, 3 are only possible, and the control for the injection efficiencies of the p- and n-type regions is unsatisfactory. On-state snap-back effects, which are defined by the point at which the conduction voltage and current characteristics change from MOS operation mode to IGBT operation mode, can occur, which are undesirable for the device in the IGBT mode. FIG. 7 shows the output characteristics of the RC-IGBT current $I_c$ to voltage $V_{ce}$. The dashed line 14 shows the strong overshoot resulting from the snap-back effect, as it is typical for a conventional RC-IGBT during the change from MOS to IGBT operation mode. FIG. 8 shows the RC-IGBT current waveform in the diode mode during reverse recovery of the device. A conventional RC-IGBT shows a snappy behavior of the device during reverse recovery (dotted line 17). The snappy behavior is also present during turn-off for the IGBT as well as for the diode reverse recovery.

SUMMARY

A method is provided for manufacturing a reverse-conducting semiconductor device, which includes a freewheeling diode and an insulated gate bipolar transistor on a common wafer of a first conductivity type. The insulated gate bipolar transistor includes an emitter side and a collector side. The exemplary method includes providing a wafer with a first side and a second side opposite the first side. The first side of the wafer forms the emitter side of the insulated gate bipolar transistor, and the second side of the wafer forms the collector side of the insulated gate bipolar transistor. The exemplary method also includes manufacturing the reverse-conducting semiconductor device on the collector side of the insulated gate bipolar transistor. The manufacturing step includes creating at least one of at least one third layer of a first or second conductivity type and a first layer, which is of the same conductivity type as the at least one third layer and which is a continuous layer, on the second side of the wafer, before at least one second layer of a different conductivity type than the at least one third layer is formed on the second side of the wafer, such that the at least one second and third layers are arranged alternately in the reverse-conducting semiconductor device. In the creating of the at least one third layer before the formation of the second layer on the second side of the wafer, a shadow mask, which has at least one opening and which is not attached to the wafer, is applied on the second side, and after application of the wafer, the at least one third layer is created through the at least one opening of the shadow mask. In the creating of the first layer before the formation of the second layer on the second side of the wafer, the first layer is created on the second side, and a shadow mask, which has at least one opening, is applied on the first layer, and at least one electrically conductive island, which is part of a second electrical contact in the reverse-conducting semiconductor device, is created through the at least one opening of the shadow mask. The manufacturing step also includes using the at least one electrical conductive island as a mask for the creation of the at least one second layer, and parts of the first layer which are covered by an electrical conductive island form the at least one third layer. In addition, the manufacturing step includes creating a second electrical contact, which is in direct electrical contact with the at least one second and third layers, on the second side of the wafer.

A reverse-conducting semiconductor device is provided. The semiconductor device includes a wafer, where part of the wafer constitutes a base layer which is of a first conductivity type, a freewheeling diode arranged on the wafer, and a punch-through insulated gate bipolar transistor arranged on the wafer. The insulated gate bipolar transistor includes an emitter side and a collector side arranged opposite of the emitter side. A first electrical contact is arranged on the emitter side, and a second electrical contact is arranged on the collector side. At least one third layer of a first or second conductivity type, and at least one second layer of a different conductivity type than the at least one third layer are arranged on the collector side. The at least one second and third layers are arranged alternately in the insulated gate bipolar transistor. A second electrical contact is arranged on the collector side, the second electrical contact being in direct electrical contact with the at least one second and third layers. The at least one second layer is arranged in a first plane parallel to the collector side. The at least one third layer is arranged in a second plane parallel to the collector side. The second plane is arranged farther from the emitter side than the first plane. The first plane and the second plane are spaced from each other by at least a thickness of the at least one third layer. A buffer layer of the first conductivity type is arranged between the base layer and the at least one second and third layers.

BRIEF DESCRIPTION OF DRAWINGS

Additional refinements, advantages and features of the present disclosure are described in more detail below with reference to exemplary embodiments illustrated in the drawings, in which.

The reference symbols used in the drawings and their meaning are summarized in the list of reference symbols. Generally, alike or alike-functioning parts are given the same reference symbols. The described embodiments are meant as examples and shall not confine the disclosure.

DETAILED DESCRIPTION

Figure 1:
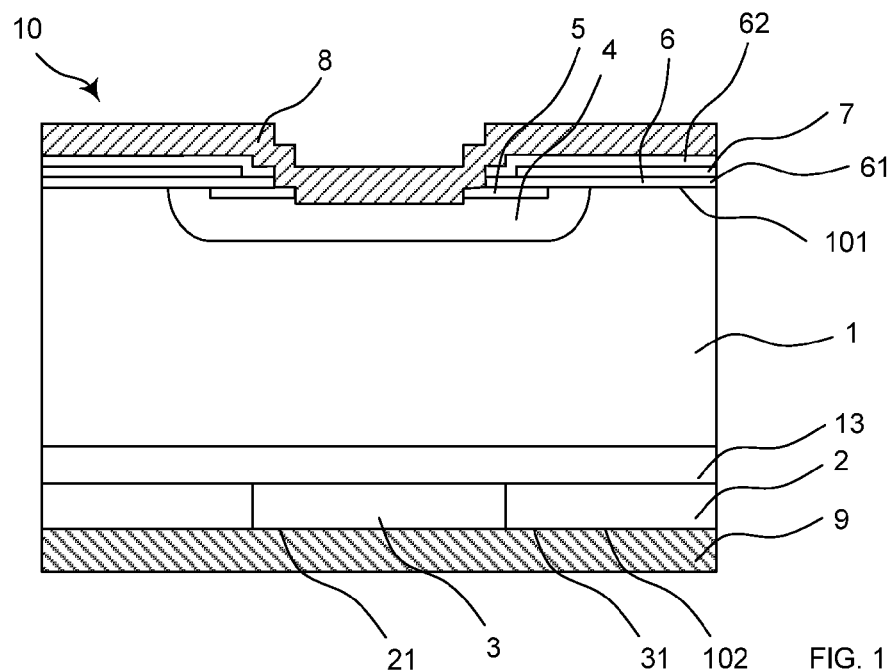
FIG. 1 shows a cross sectional view of a conventional reverse-conducting IGBT.

Exemplary embodiments of the present disclosure provide a method for manufacturing a reverse-conducting semiconductor device, which is less susceptible for on-state snapback effects than conventional RC-IGBTs, and which provides better control for the above mentioned electrical properties of the diode and IGBT, such as for thin low-voltage RC-IGBTs. Exemplary embodiments of the present disclosure also provide such a reverse-conducting semiconductor device, and a converter with such a reverse-conducting insulated gate bipolar transistor.

In the exemplary method for manufacturing a reverse-conducting semiconductor device with a freewheeling diode and an insulated gate bipolar transistor on a common wafer of a first conductivity type, the insulated gate bipolar transistor includes an emitter side and a collector side, and a wafer includes a first side and a second side opposite the first side. The first side forms the emitter side, and the second side forms the collector side of the insulated gate bipolar transistor.

For the manufacturing of the reverse-conducting semiconductor device on the collector side, the following steps can be performed:

At least one third layer of a first or second conductivity type, or a first layer, which is of the same conductivity type as the third layer and which is a continuous layer, is created on the second side before at least one second layer of a different conductivity type than the third or first layer is created on the second side. The at least one second and third layers being arranged alternately in the finalized RC-IGBT;

Afterwards, a second electrical contact, which is in direct electrical contact with the at least one second and third layer, is created on the second side;

A shadow mask, which has at least one opening, is applied on the second side and afterwards the at least one third layer is created through the shadow mask;

Alternatively, the first layer can be created on the second side, afterwards a shadow mask with at least one opening is applied on the first layer, and at least one electrical conductive island, which is part of a second electrical contact in the finalized reverse-conducting insulated gate bipolar transistor, is created through the shadow mask. The at least one electrical conductive island is used as a mask for the creation of the at least one second layer and those parts of the first layer, which are covered by an electrical conductive island form the at least one third layer.

According to an exemplary embodiment, annealing for the activation of the second layer and third layer can be performed. The annealing may be performed directly after the creation of each layer or at any later stage during the manufacturing or the anneal steps for the activation of the second and third layers could be performed together.

The reverse-conducting semiconductor device according to exemplary embodiments of the present disclosure includes a seventh layer formed as a gate electrode and a first electrical contact on a emitter side, and a second electrical contact on a collector side, which is opposite the emitter side. At least one third layer of a first conductivity type, and at least one second layer of a different conductivity type than the third layer, are arranged on the collector side. The at least one second and third layers are arranged alternately, and a second electrical contact, which is arranged on the collector side and which is in direct electrical contact with the at least one second and third layer, is provided. The at least one second layer is arranged in a first plane parallel to the collector side, and the at least one third layer is arranged in a second plane parallel to the collector side. The second plane is arranged farther from the emitter side than the first plane, and the first plane and the second plane are spaced from each other by at least the thickness of the at least one third layer. Alternately, the first and second plane coincident, i.e. the second and third layers are arranged in the same plane.

With such a manufacturing method for an inventive RC-IGBT, an RC-IGBT can be provided with good control for the second and third layers, i.e. the cathode layer in the diode and the collector layer in the IGBT part of the device. The manufacturing is suitable to be performed with thin wafers (e. g. below 200 μm) and as the final semiconductor devices can also be made thin such devices are especially suitable for low voltages, e.g. below 1700 V.

Figure 7:
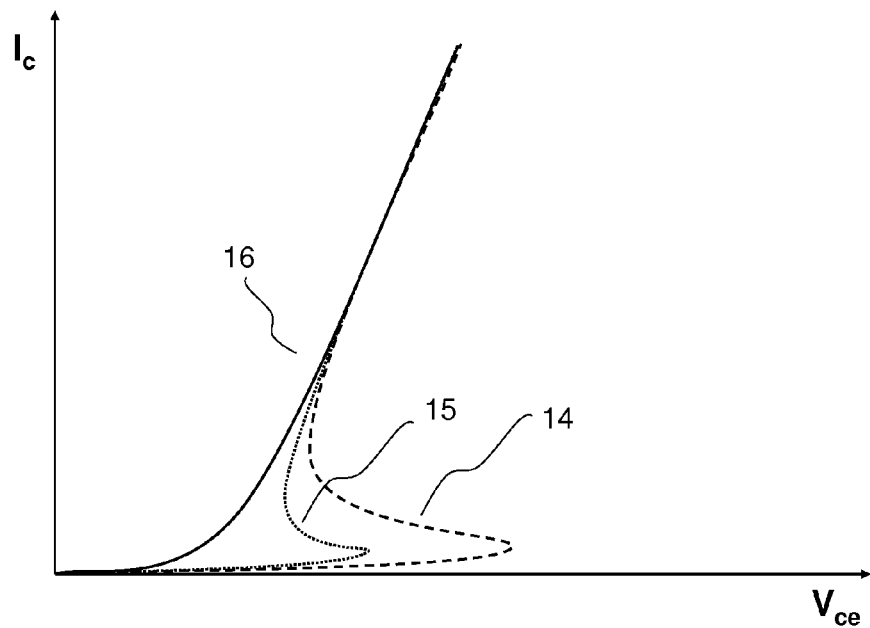
FIG. 7 shows the current/voltage output characteristics of a conventional RC-IGBT and an exemplary RC-IGBT according to the present disclosure.
Figure 8:
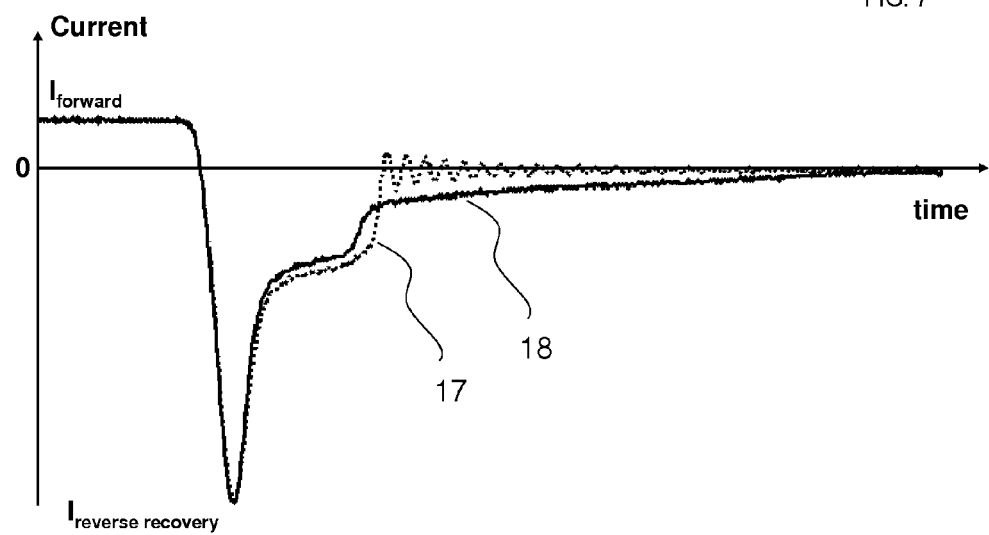
FIG. 8 shows the RC-IGBT current waveform in a diode mode during reverse recovery of a conventional RC-IGBT and an exemplary RC-IGBT according to the present disclosure.
Figure 32:
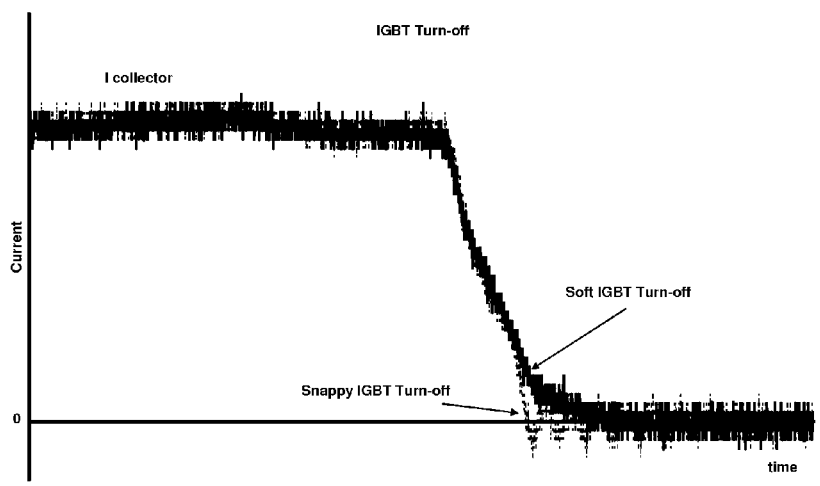
FIG. 32 shows the RC-IGBT current waveform in a diode mode during turn-off of a conventional RC-IGBT and an exemplary RC-IGBT according to the disclosure.

Especially when the inventive RC-IGBT is manufactured with at least one second and third layer, one of these layer types having a stronger p-doping than the n-doping of the other layer, snap-back effects are further minimized or even eliminated (dotted line 15 and solid line 16 in FIG. 7). That at least one layer of the second or third layers, which is of a different conductivity type than the first layer, is created with a higher dose than that at least one layer of the second and third layer, which is of the same conductivity type as the first layer. According to an exemplary embodiment, this at least one second and/or third layers has stronger p-doping than n-doping also for diode properties as well as for IGBT properties. Furthermore, stronger p-doping provides soft diode recovery reducing or eliminating overshooting of the current during reverse recovery due to hole injection from that layer of the second and third layer, which is p doped, (FIG. 8, solid line 18). The soft performance is also achieved for the IGBT turn-off as well as for the diode reverse recovery as shown in FIG. 32.

Figure 2:
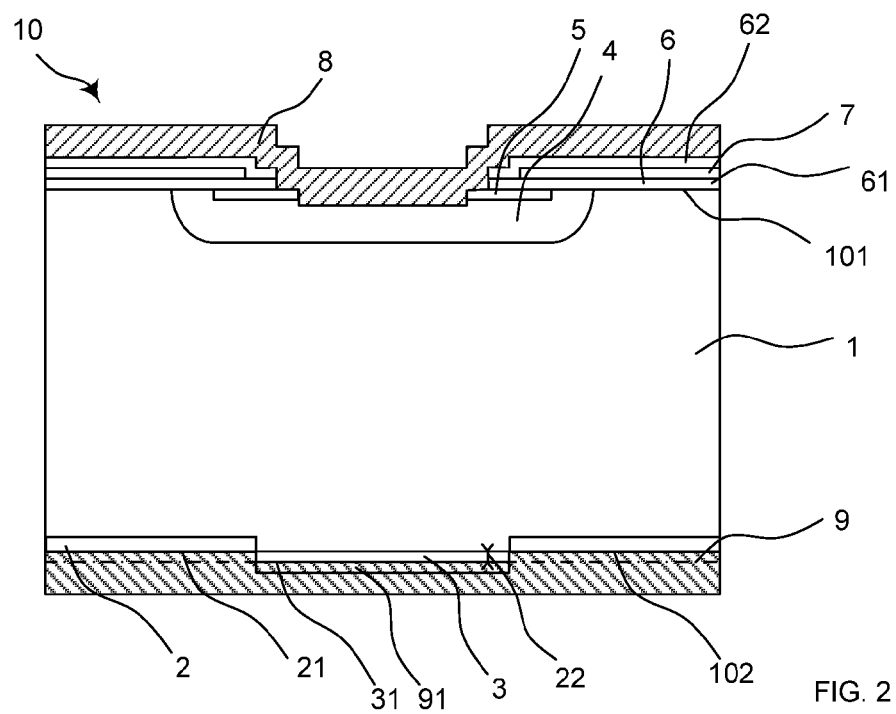
FIG. 2 shows a cross sectional view of an exemplary embodiment of a reverse-conducting IGBT according to the present disclosure.

FIG. 2 illustrates a first exemplary embodiment of an inventive reverse-conducting semiconductor device, which is also called reverse-conducting insulated gate bipolar transistor 10 (RC-IGBT). The RC-IGBT 10 includes an n-type base layer 1 with an emitter side 101 and a collector side 102 opposite the emitter side 101. A p-type fourth layer 4 is arranged on the emitter side 101. At least one n-type fifth layer 5 is arranged on the emitter side 101 and is surrounded by the fourth layer 4. The at least one fifth layer 5 has a higher doping than the base layer 1. A sixth electrically insulating layer 6 is arranged on the emitter side 101 on top of the first, fourth and fifth layers 1, 4, 5. The sixth layer 6 at least partially covers the at least one fifth layer 5, the fourth layer 4 and the base layer 1. An electrically conductive seventh layer 7 is arranged on the emitter side 101 and is electrically insulated from the at least one fourth layer 4, the fifth layer 5 and the base layer 1 by the sixth layer 6. According to an exemplary embodiment, the seventh layer 7 can be embedded in the sixth layer 6.

According to an exemplary embodiment, the sixth layer 6 can include a first electrically insulating layer 61, and a second electrically insulating layer 62. The first and second electrically insulating layers 61, 62 can be made of a silicon dioxide, for example, and can be made of the same material. The second electrically insulating layer 62 covers the first electrically insulating layer 61. For an RC-IGBT 10 with a seventh layer 7 formed as a planar gate electrode as shown in FIG. 2, the first electrically insulating layer 61 is arranged on top of the emitter side 101. The seventh layer 7, which forms a gate electrode, can be embedded in between the first and second electrically insulating layers 61, 62, which form the sixth layer 6. According to an exemplary embodiment, the seventh layer 7 can be completely embedded between the first and second electrically insulating layers 61, 62. Thus, the seventh layer 7 is separated from the first, fourth and fifth layers 1, 4, 5 by the first electrically insulated layer 61. The seventh layer 7 can be made of a heavily doped polysilicon or a metal like aluminum, for example.

The at least one fifth layer 5, the seventh layer 7 and the sixth layer 6 are formed in such a way that an opening is created above the fourth layer 4. The opening is surrounded by the at least one fifth layer 5, the seventh layer 7 and the sixth layer 6.

A first electrical contact 8 is arranged on the emitter side 101 within the opening so that the first electrical contact 8 is in direct electrical contact with the fourth layer 4 and the fifth layer 5. This first electrical contact 8 can also cover the sixth layer 6, but is separated and thus electrically insulated from the seventh layer 7 by the second electrically insulating layer 62.

At least one n-type third layer 3 and at least one p-type second layer 2 are arranged on the collector side 102. The third layer 3 has a higher doping than the base layer 1. The at least one second layer 2 is arranged in a first plane 21 parallel to the collector side 102, and the at least one third layer 3 is arranged in a second plane 31 (dashed line) that is also parallel to the collector side 102. The first plane 21 and the second plane 31 are spaced from each other at least by the thickness of the layer, which is arranged farther away from the emitter side 101, i.e. of the at least one third layer 3. The at least one second and third layers 2, 3 are arranged alternately.

Alternately, the first and second plane 21, 31 can be coincident, i.e. the second and third layers 2, 3 are arranged in the same plane.

As used herein, the first and second plane 21, 31 shall be understood as the plane which corresponds to the surface of the respective layer which lies opposite the base layer 1, ie. in the finalized device, that side of the layer is meant as the surface (plane) on which the second electrical contact 9 is arranged.

Figure 31:
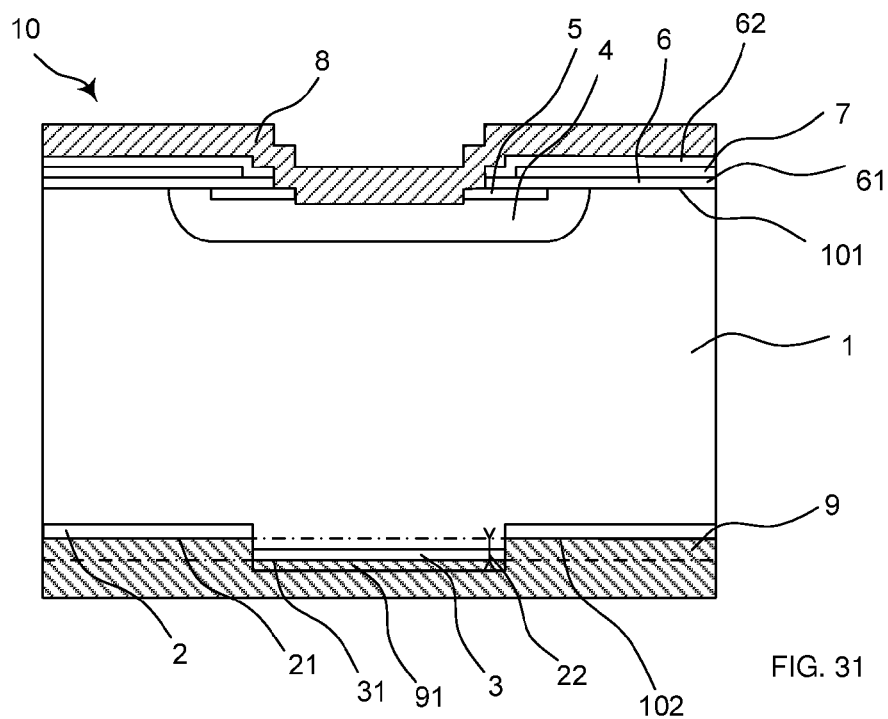
FIG. 31 shows a cross sectional view of another exemplary embodiment of a reverse-conducting IGBT according to the present disclosure.

In FIG. 2 it is shown that the n-type third layers 3 are arranged farther away from the emitter side 101. The first plane 21 of the second layer 2 may have a distance 22 from the second plane 31 of the third layer 3, which corresponds to the thickness of the third layer 3, but alternatively the distance may be greater than the thickness of the third layers 3 (FIG. 31) so that in any case no part of the third layers 3 extends into the first plane 21.

Figure 5:
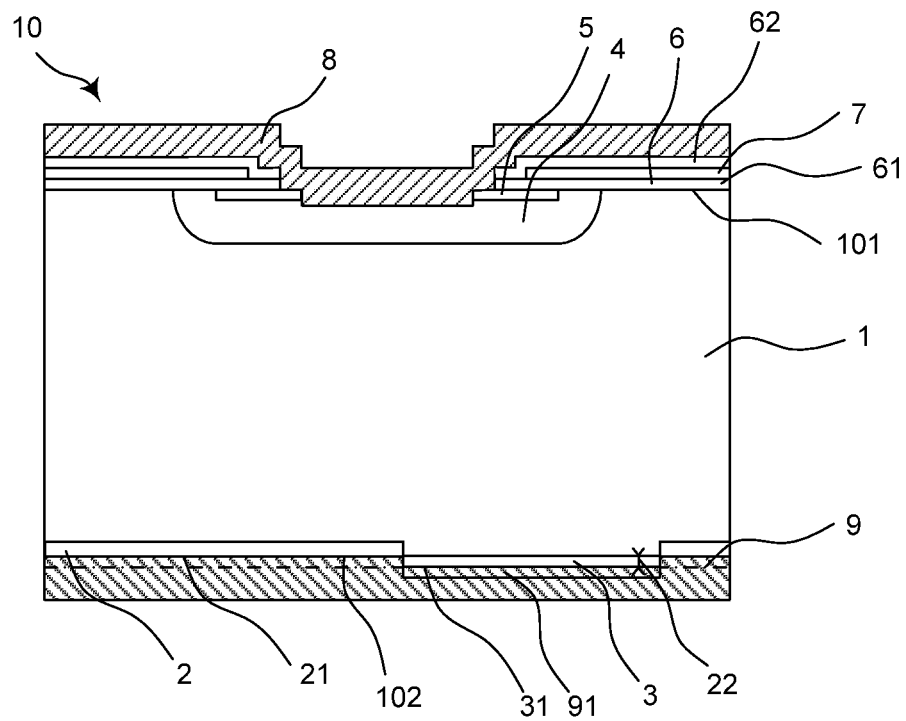
FIG. 5 shows a cross sectional view of another exemplary embodiment of a reverse-conducting IGBT according to the present disclosure.

In accordance with an exemplary embodiment, the third layer 3 is arranged directly below the first electrical contact 8, but the position of the third layer 3 can also be shifted to a side as shown in FIG. 5. It is not necessary to have the third layer 3 aligned to the first electrical contact 8.

In another exemplary embodiment, the first plane 21 and the second plane 31 are spaced from each other by a distance between 50 nm up to 2 μm, such as up to 1 μm, for example. In this case, the third layer 3 has a thickness of less than 50 nm up to 2 μm, such as up to 1 μm, depending on the distance of the first and second plane 21, 31.

A second electrical contact 9 is arranged on the collector side 102 and is in direct electrical contact with the at least one second and third layers 2, 3. According to an exemplary embodiment, Ti, Ni, Au or Al can be used as a material for the second electrical contact 9. In the drawings, the second electrical contact 9 includes electrically conductive islands 91, which can be made of the same material as the second electrical contact 9. Depending of the manufacturing method, the second electrical contact 9 may also be made without separately having created electrically conductive islands 91.

As an alternative to what is described above, the conductivity types of the second and third layers 2, 3 are reversed, i.e. in this case the second layer 2 is n-type and the third layer 3 is p-type.

Figure 4:
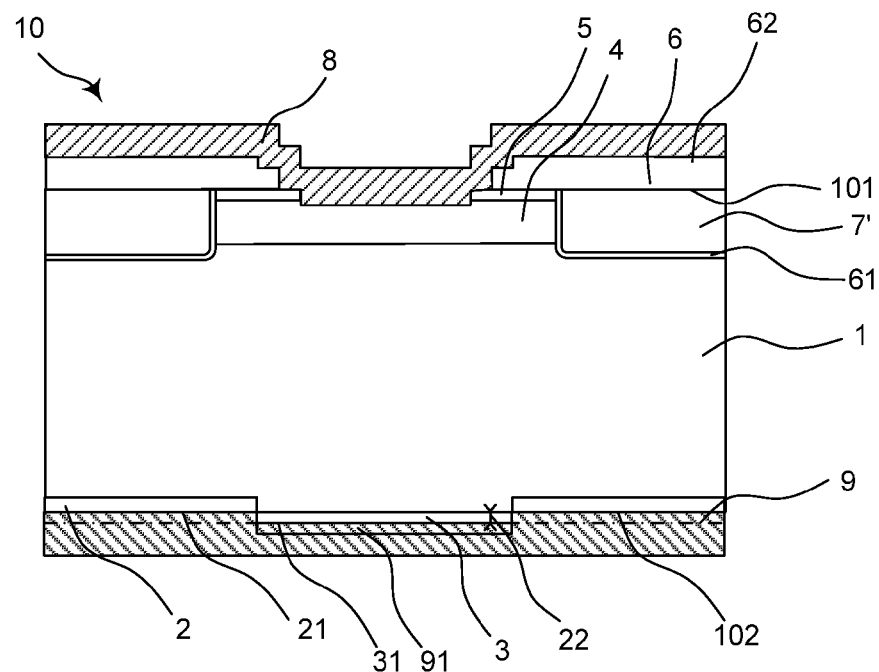
FIG. 4 shows a cross sectional view of another exemplary embodiment of a reverse-conducting IGBT according to the present disclosure.

Alternatively to the inventive RC-IGBT with a planar gate electrode, the inventive RC-IGBT may comprise a seventh layer 7', which is formed as trench gate electrode as shown in FIG. 4. The trench gate electrode 7' is arranged in the same plane as the fourth layer 4 and adjacent to the fifth layer 5. The seventh layer 7' is separated from the fourth and fifth layers 4, 5 by a first insulating layer 61, which also separates the seventh layer 7' from the base layer 1. A second insulating layer 62 is arranged on top of the seventh layer 7' formed as a trench gate electrode 7', thus insulating the seventh layer 7' from the first electrical contact 8.

Figure 3:
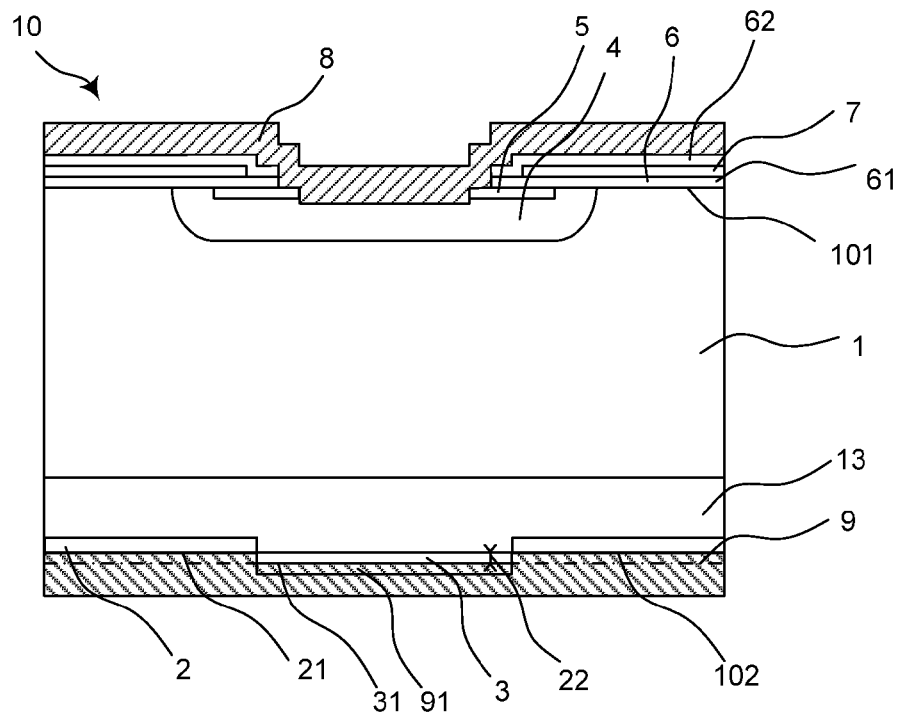
FIG. 3 shows a cross sectional view of another exemplary embodiment of a reverse-conducting IGBT according to the present disclosure.

As shown in FIG. 3, in accordance with another exemplary embodiment, the RC-IGBT 10 further includes an n-type buffer layer 13, which is arranged between the base layer 1 and the first 21 or second plane 31 respectively, in which the at least one second and third layers 2, 3 are arranged. The buffer layer 13 has a higher doping than the base layer 1. With such a buffer layer 13, the reverse conducting semiconductor device 10 comprises an IGBT which acts as a punch-through IGBT.

Figure 6:
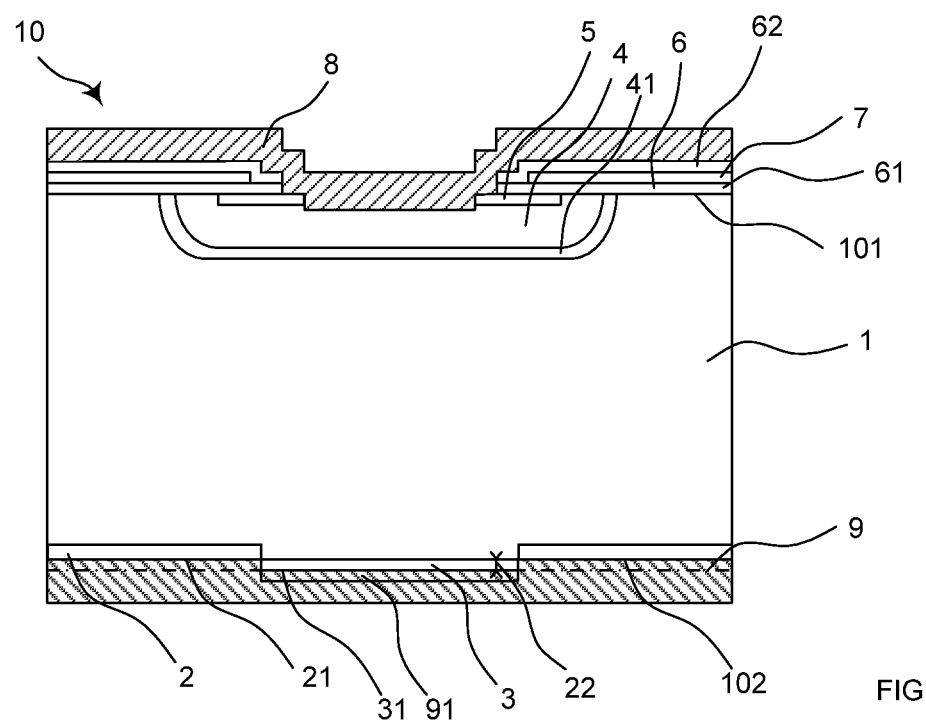
FIG. 6 shows a cross sectional view of another exemplary embodiment of a reverse-conducting IGBT according to the present disclosure.

In accordance with another exemplary embodiment shown in FIG. 6, a ninth n-doped layer 41, which is formed as an enhancement layer, is arranged between the fourth layer 4 and the base layer 1 for having lower on-state losses. The ninth layer 41 separates the fourth layer 4 from the base layer 1 and has higher doping than the base layer 1.

In accordance with another exemplary embodiment, the conductivity types of the layers are switched, i.e. all layers of the first conductivity type are p-type (e.g. the base layer 1) and all layers of the second conductivity type are n-type (e.g. the fourth layer 4). Also, in this case, the second layer 2 may be of n-type or p-type, and the third layer 3 may be of the reverse conductivity type, i.e. p-type (incase of n-type second layer 2) or n-type (in case of p-type second layer 2).

In the inventive RC-IGBT 10, a diode is formed between the first electrical contact 8, which forms an anode electrode in the diode, the fourth layer 4, part of which forms an anode layer, the base layer 1, part of which forms a base layer, that layer of the second layer 2 or third layer 3, which is of n-type and which layer forms a cathode layer (in the case of FIG. 2: the n-type third layer 3), and the second electrical contact 9, which forms a cathode electrode.

In the inventive RC-IGBT 10, an insulating bipolar transistor (IGBT) is formed between the first electrical contact 8, which forms an emitter electrode in the IGBT, the fifth layer 5, which forms a source region, the fourth layer 4, part of which forms a channel region, the base layer 1, part of which forms a base region, that layer of the third layer 3 or the second layer 2, which is of p-type and which forms a collector layer (in the case of FIG. 2: the p-type second layer 2), and the second electrical contact 9, part of which forms a collector electrode.

The inventive reverse-conducting semiconductor device 10 can be used in a converter, for example.

Figure 9:
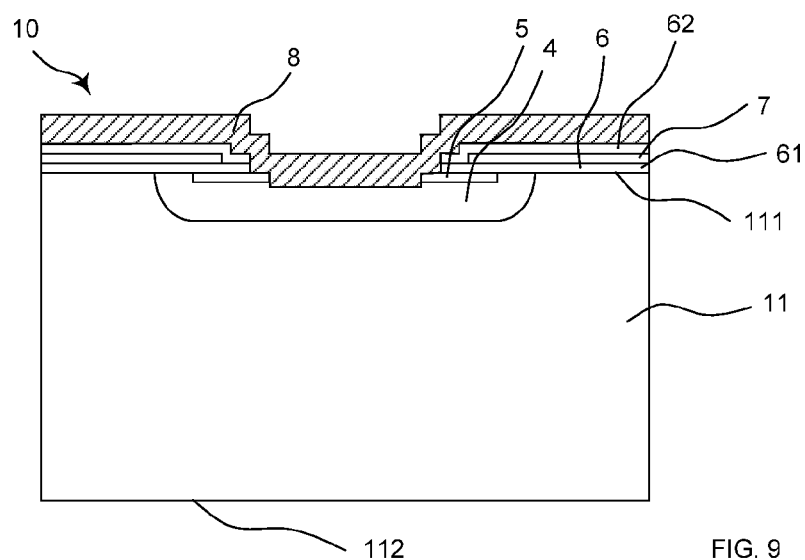
FIG. 9-30 shows different manufacturing steps in manufacturing methods of an exemplary reverse-conducting IGBT according to the present disclosure.

According to an exemplary embodiment for manufacturing an inventive reverse-conducting semiconductor device 10 with a seventh layer 7 formed as a planar gate electrode, a first electrical contact 8 on a emitter side 101, and a second electrical contact 9 on a collector side 102, which is opposite the emitter side 101, the following steps can be performed for forming the layers on the emitter side 101 of the RC-IGBT 10, resulting in a semi-fabricated RC-IGBT 10 as shown in FIG. 9.

An n-type wafer 11 with a first side 111 and a second side 112 opposite the first side 111 is provided. The part of the wafer 11 which has an unamended doping in the finalized reverse-conducting insulated gate bipolar transistor forms a base layer 1.

A first electrically insulating layer 61 is partially created on the first side 111.

An electrically conductive seventh layer 7 is created on the first side 111, on which the first electrically insulating layer 61 is arranged. The seventh layer 7 can be made of a heavily doped polysilicon or a metal like aluminum, for example.

Afterwards, a p-type fourth layer 4 is created on the first side 111.

Then, at least one n-type fifth layer 5, which is surrounded by the fourth layer 4, is created on the first side 111. The fifth layer 5 has a higher doping than the base layer 1.

According to an exemplary embodiment, a second electrically insulating layer 62 is formed on the electrically conductive seventh layer 7 in such a way, that the seventh layer 7 is arranged between the first and second electrically insulating layers 61, 62. For example, the seventh layer 7 can be completely embedded between the first and second electrically insulating layers 61, 62. The second electrically insulating layer 62 can be made of a low-temperature silicon dioxide material as described above. The first and second electrically insulating layers 61, 62 form a sixth layer 6.

The at least one fifth layer 5, the sixth layer 6 and the seventh layer 7 are created in such a way that they form an opening above the fourth layer 4.

A first electrical contact 8 is created on the first side 111, which is arranged within the opening and which is in direct electrical contact to the fourth layer 4 and the fifth layer 5. Typically the first electrical contact 8 covers the sixth layer 6.

Similar steps, well-known to semiconductor experts, are performed for an RC-IGBT with a trench-gate structure 7' (see, e.g., FIG. 4).

According to an exemplary embodiment, although not necessary, the layers on the second side 112 of the wafer 11 are manufactured after manufacturing the layers on the first side 111, either before or after creating the first electrical contact 8 or at any stage during the manufacturing of the layers on the second side 112.

Figure 10:
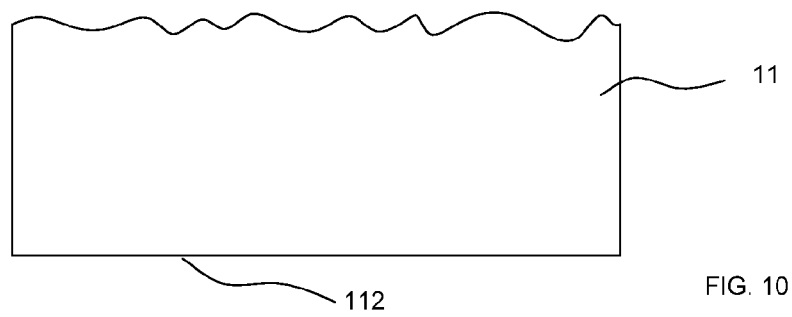

In the following, an exemplary method for fabricating the layers of the RC-IGBT on the collector side 102 is explained. As shown in FIG. 10, an n-type wafer 11 with a first side 111 and a second side 112 opposite the first side 111 is provided. In FIG. 10, only the second side 112 of the wafer 11 is shown. On the first side 111, part or all of the layers, which are arranged on that side in the finalized RC-IGBT may have been manufactured before, such as by using a semi-fabricated RC-IGBT as shown in FIG. 9, for example. For the manufacturing of low voltage devices (e.g. for voltages below 1700 V) a thinning step of the wafer 11 can be performed on the second side 112 before performing any other processing step on the second side 112 as described below.

That part of the wafer 11 which has an unamended doping in the finalized reverse-conducting insulated gate bipolar transistor forms a base layer 1.

A shadow mask 12 can be used in any of the exemplary manufacturing methods described herein. Such a shadow mask 12 is a mask that is not attached to the wafer 11, and therefore, can easily be removed even if a thin wafer is provided, which can be desirable in the manufacturing of low voltage semiconductor devices, for example. According to an exemplary embodiment, the shadow mask 12 is made of a metal and can include at least one opening 121, or a plurality of openings 121, through which particles can be deposited, e.g. by evaporation, sputtering or by chemical vapor deposition such as plasma enhanced chemical vapor deposition (PECVD) or low pressure chemical vapor deposition (LPCVD). The openings 121 can have any desired shape for the layers to be manufactured. In the drawings, the shadow mask 12 is shown with a small distance to the wafer 11 to emphasize that the shadow mask 12 is not fixed to the wafer 11 and can, therefore, be easily removed.

Figure 11:
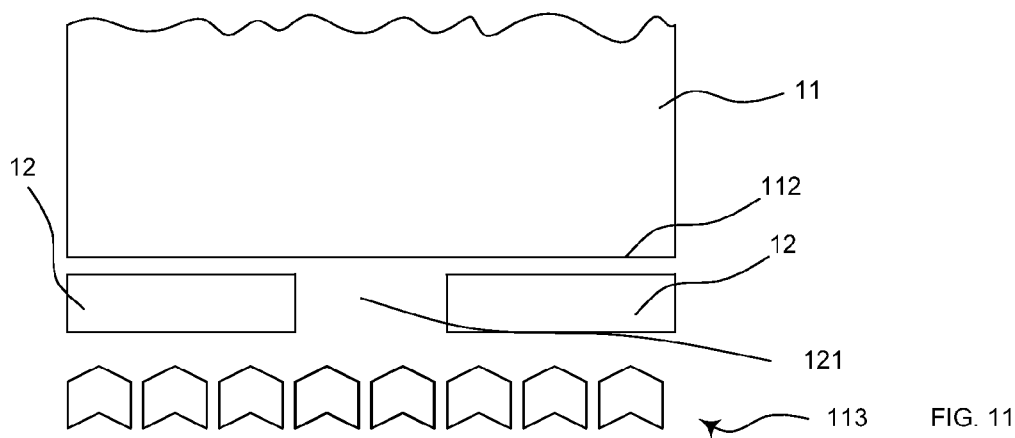
Figure 12:
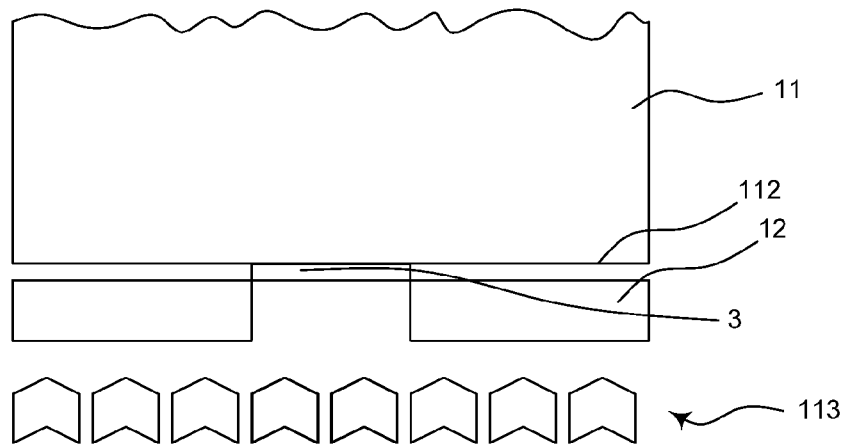
Figure 13:
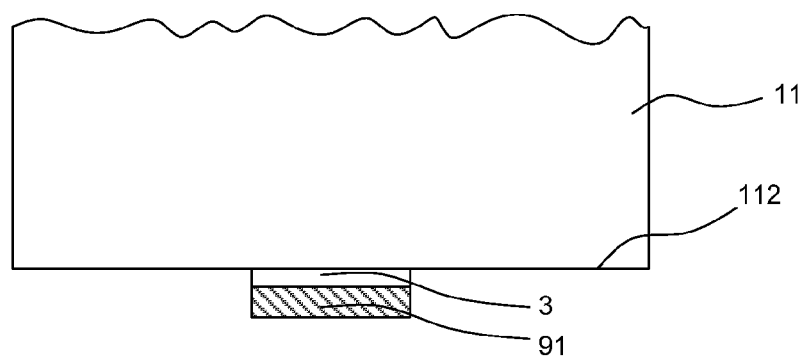

In accordance with a first exemplary embodiment of a method for manufacturing of the reverse-conducting semiconductor device 10 on the collector side 112, the following steps are performed:

At least one n-type third layer 3, which has a higher doping than the base layer 1, is created on the second side 112 before at least one p-type second layer 2 is also created on the second side 112. For the creation of the at least one third layer 3, a shadow mask 12 is applied on the second side 112, and afterwards the at least one third layer 3 is created through the shadow mask 12 (FIG. 11). For example, the third layer 3 can be created by deposition 113 of particles as n-type pre-doped amorphous silicon, indicated in FIG. 11 by broad arrows 113. Afterwards, the same shadow mask 12 is used for depositing metal 113' through the openings 121 of the shadow mask 12 on the third layers 3 (FIG. 12), thereby creating electrically conductive islands 91 (FIG. 13), which are part of the second electrical contact 9 in the finalized RC-IGBT. According to an exemplary embodiment, Ti, Ni, Au or Al can be used as a material for creating the electrically conductive islands 91. Afterwards, an anneal step for activating the third layers 3 may be performed.

Figure 14:
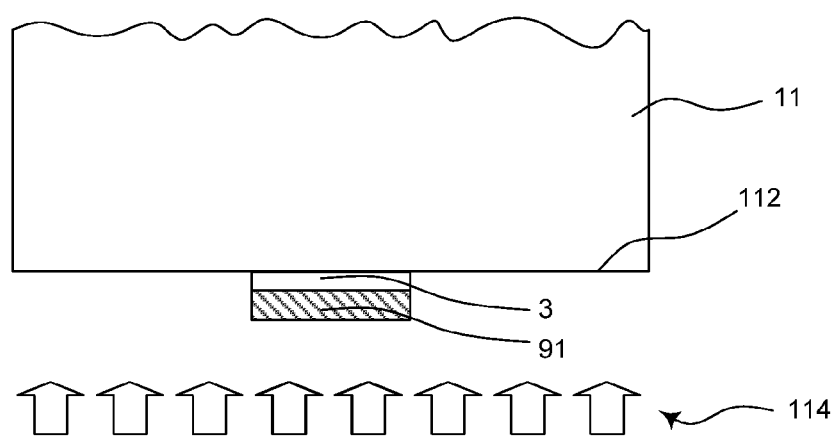
Figure 15:
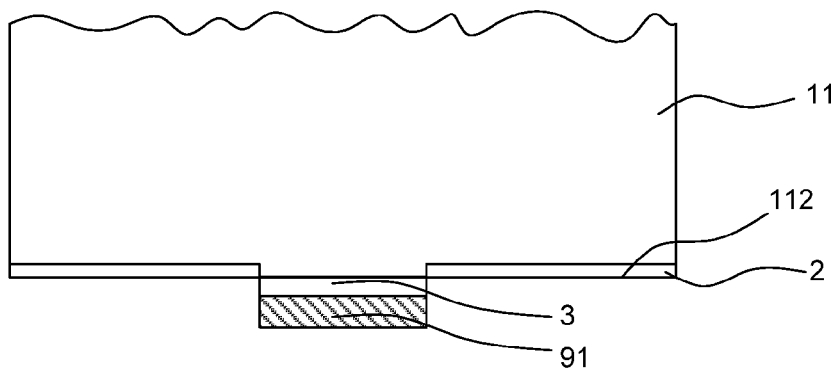

Then, the shadow mask 12 is removed and p-type ions are implanted 114 on the second side 112 (FIG. 14, implantation 114 indicated by narrower arrows). The electrically conductive metal islands 91 act as a mask so that the p-type ions are implanted only on those parts on the second side 112 of the wafer on which no third layer 3, which is covered by a metal island 91, is positioned. By this process, the p-type second layers 2 are created (FIG. 15), which are arranged alternately with the n-type third layers 3. An anneal step may follow for activating the second layers 2.

For finalizing the RC-IGBT 10, a second electrical contact 9 is created on the second side 112 on the second and third layers 2, 3 so that the second electrical contact 9 is in direct electrical contact with the second and third layer 2, 3. For example, metal can be deposited 113' on the second side 112 for creating the second electrical contact 9. The electrically conductive islands 91 are part of the second electrical contact 9 and they may be made of the same material, but different materials could also be used.

In accordance with another exemplary embodiment of a method for manufacturing an RC-IGBT, the steps as described above for creating the third layer through the openings 121 of a shadow mask 12 (FIG. 11) are performed, and an anneal step for activating the third layers 3 is performed, thus resulting in a wafer 11 with third layers 3 on its second side 112.

Figure 16:
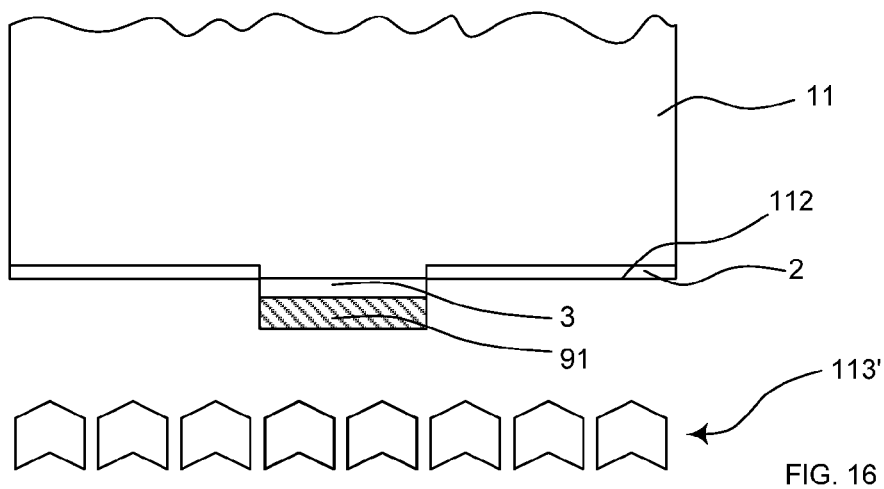
Figure 17:
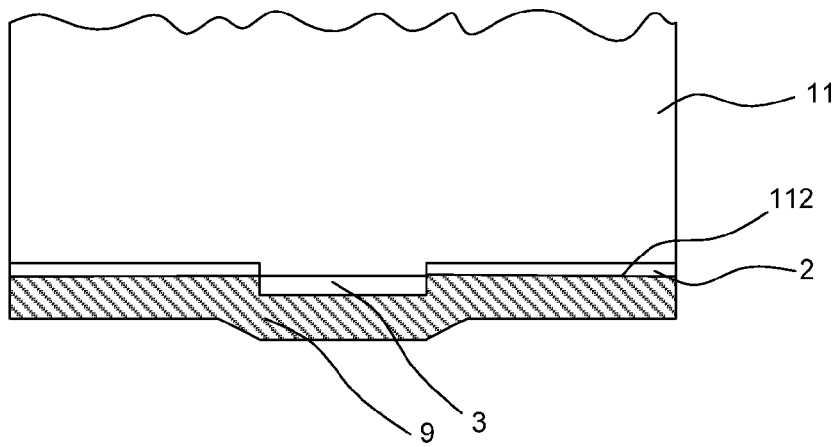
Figure 18:
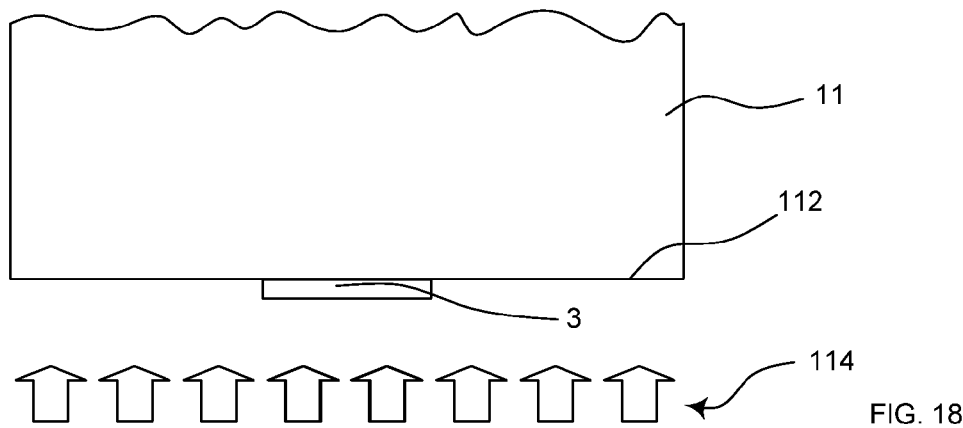
Figure 19:
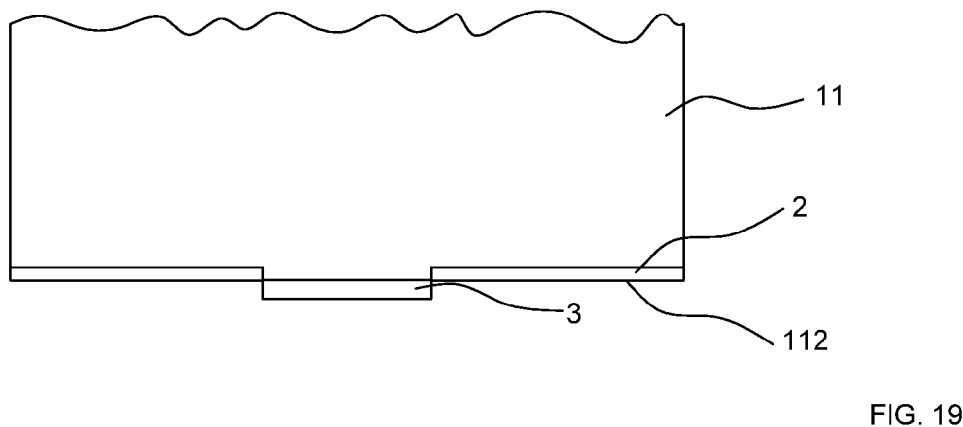
Figure 20:
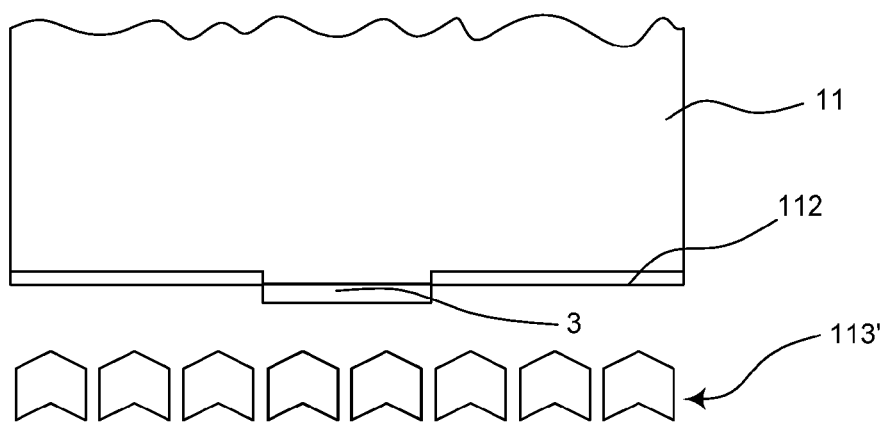

Then, for creating second layers 2, p-type ions are implanted 114 on the second side 112 (FIG. 18, implantation 114 indicated by narrow arrows). The p-type ions are implanted on the whole surface of the wafer 11 on the second side 112. The implantation 114 can be performed with such a doping that the doping of the at least one second layer 2 does not exceed the doping of the third layers 3, i.e. is lower than the doping of the third layers 3, so that the doping of the third layers 3 may not completely be compensated. By this process, the p-type second layers 2 are created (FIG. 19), which are arranged alternately with the n-type third layers 3. An anneal step may follow for activating the second layers 2. Afterwards, metal is deposited 113' on the second and third layers 2, 3 for creating a second electrical contact 9 (FIG. 20) as already described above (see FIG. 16).

Figure 21:
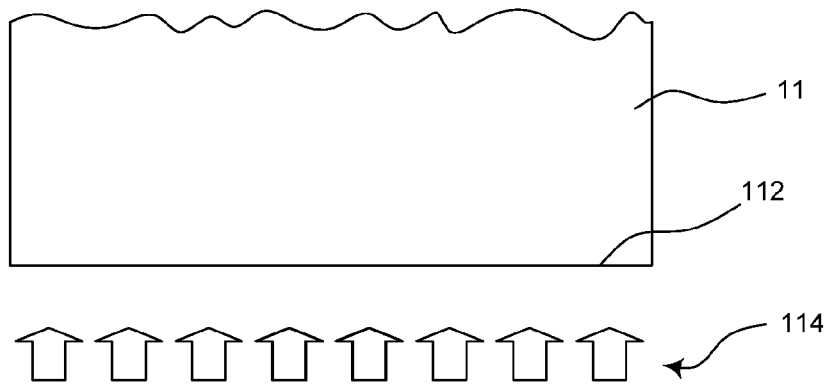
Figure 22:
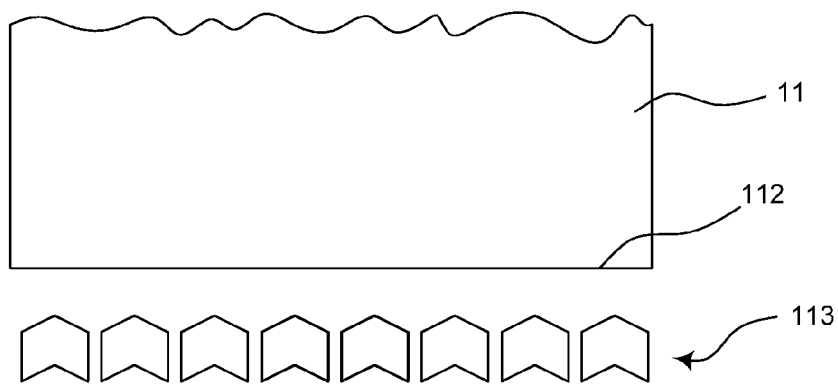
Figure 23:
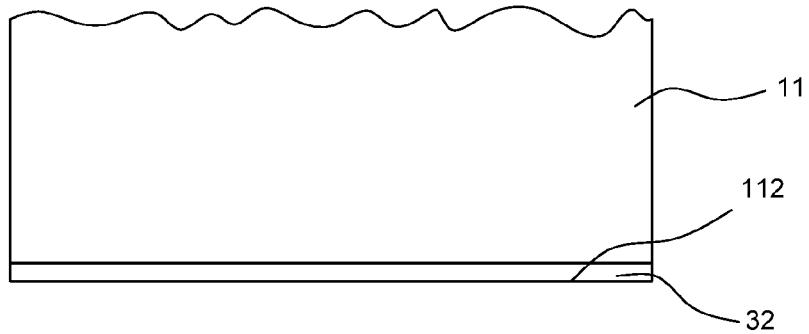

In accordance with another exemplary embodiment of a method for manufacturing an RC-IGBT, a continuous n-type first layer 32 is created on the second side 112 with a higher doping than the base layer 1. This first layer 32 may be created by implantation of ions (FIG. 21) or by deposition 114 of particles, such as n-type pre-doped amorphous silicon, for example (FIG. 22). An anneal step may follow for activating the first layer 32 (FIG. 23). Afterwards, a shadow mask 12 is used for depositing metal 113' through the openings 121 of the shadow mask 12 on the first layer 32 (FIG. 24), thereby creating electrically conductive islands 91 (FIG. 25), which are part of the second electrical contact 9 in the finalized RC-IGBT. A step of a partial removal 115 of the first layer 32 follows, by which those parts of the first layer 32, which are not covered by an electrically conductive island 91, are removed (indicated by arrows 115 in FIG. 25). The partial removal 115 can be performed by etching, e.g. by dry or wet silicon etching of the implanted ions or the deposited ions, e.g. pre-doped amorphous silicon particles.

Figure 26:
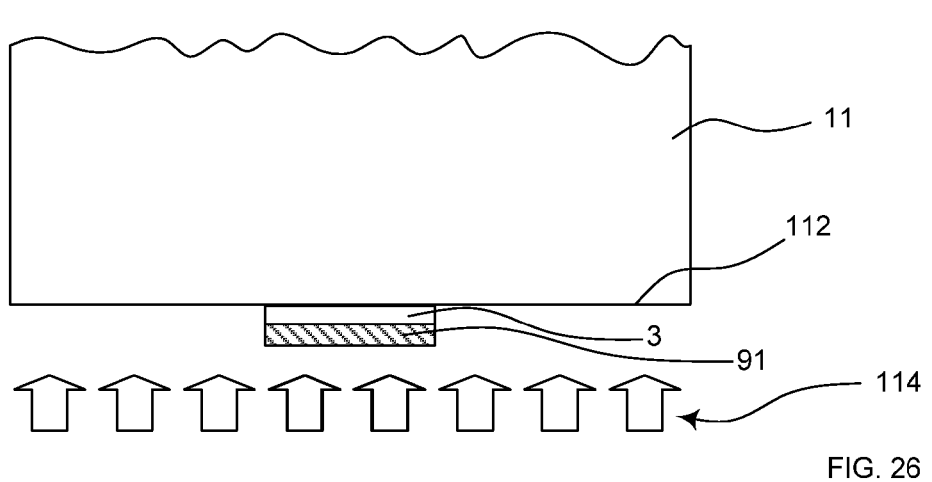
Figure 27:
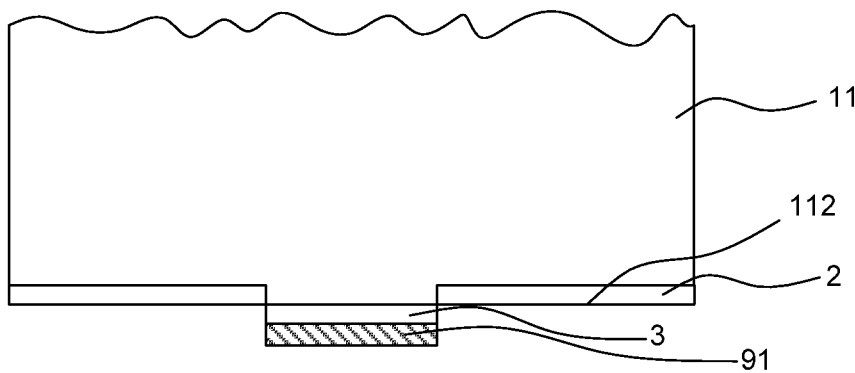

Afterwards, p-type ions are implanted 114 on the second side 112 (FIG. 26, implantation 114 indicated by narrow arrows). The electrically conductive metal islands 91 act as a mask so that the p-type ions are implanted only on those parts on the second side 112 of the wafer 11 on which no third layer 3, which is covered by a metal island 91, is positioned. By this process, the p-type second layers 2 are created (FIG. 27), which are arranged alternately with the n-type third layers 3. An anneal step may follow for activating the second layers 2. Afterwards, for finalizing the RC-IGBT, metal is deposited 113' on the second and third layers 2, 3 for creating a second electrical contact 9 as already described above (see FIG. 16).

Figure 24:
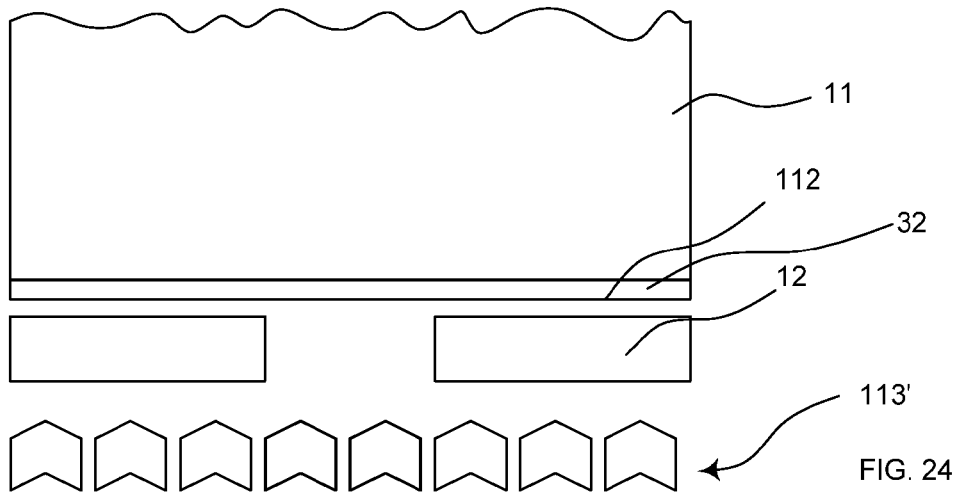
Figure 25:
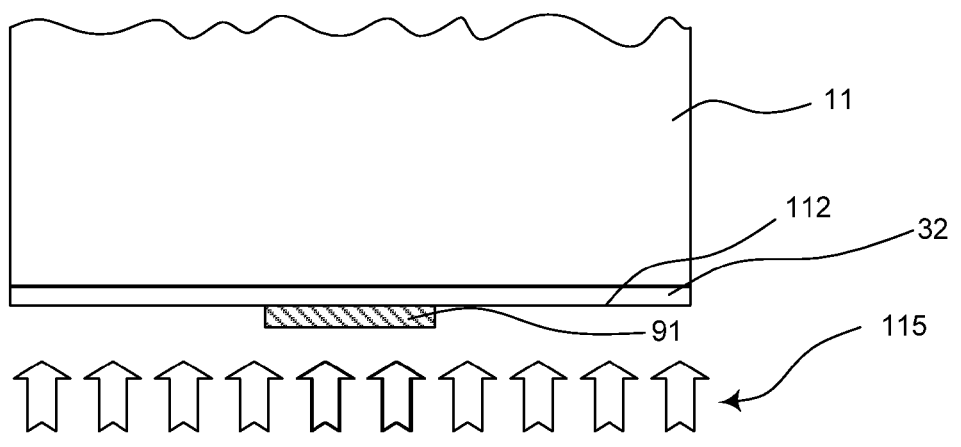
Figure 28:
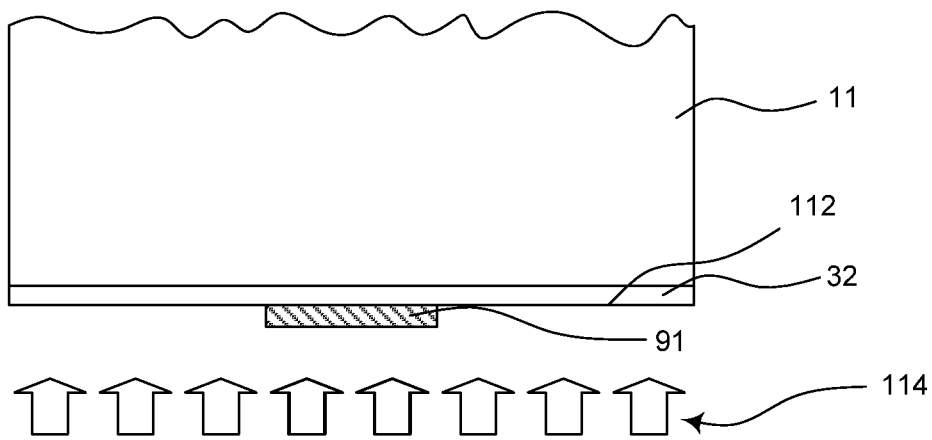
Figure 29:
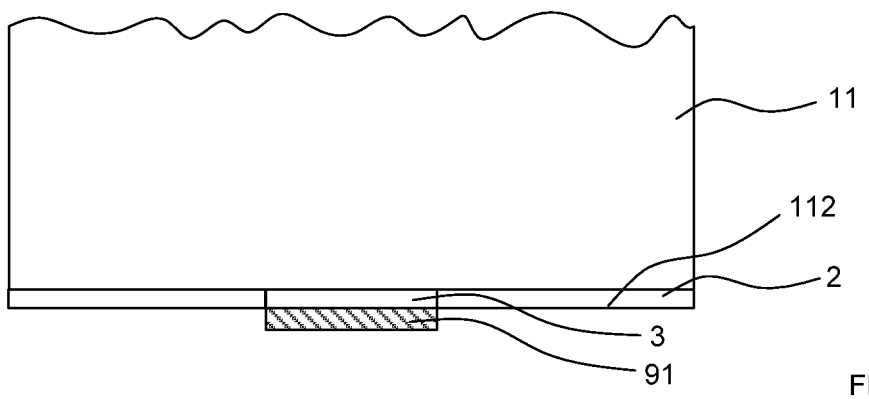
Figure 30:
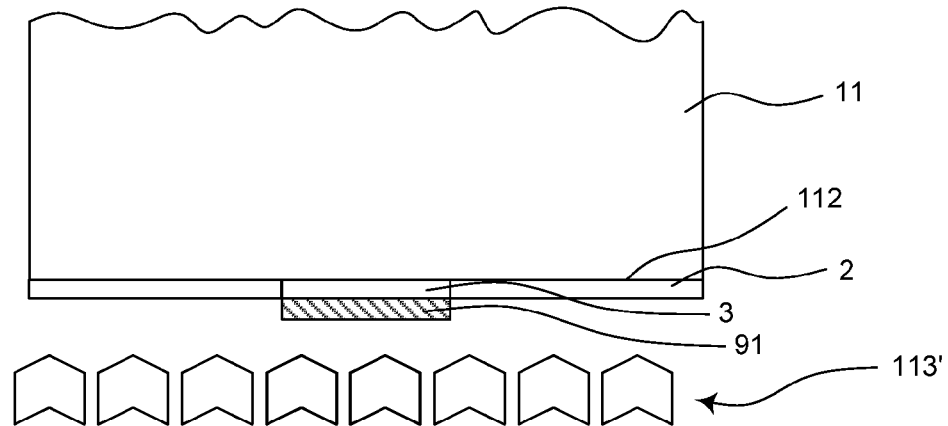

In accordance with another exemplary method for manufacturing an RC-IGBT, a continuous n-type first layer 32 is created on the second side 112 (see FIG. 21 or 22), an anneal step may follow (FIG. 23), and electrically conductive islands 91 are created through openings 121 in a shadow mask 12 (FIG. 24). The shadow mask 12 is then removed, and then, for creating second layers 2, p-type ions are implanted 114 on the second side 112 (FIG. 28, implantation 114 indicated by narrow arrows). The electrically conductive metal islands 91 act as a mask so that the p-type ions are implanted only on those parts on the second side 112 of the wafer on which no such part of the first layer 32, which is covered by a metal island 91, is positioned. Those parts of the first layer 32, which are covered by an electrically conductive island 91, form third layers 3. The implantation 114 can be performed with such a doping that the doping of the at least one second layer 2 exceeds the doping of the third layers 3, i.e. the doping of the third layers 3 is overcompensated. By this process, p-type second layers 2 are created (FIG. 19), which are arranged alternately with the n-type third layers 3. An anneal step may follow for activating the second layers 2 (FIG. 29). Afterwards, metal is deposited 113' on the second and third layers 2, 3 for creating a second electrical contact 9 (FIG. 30) as already described above (see FIG. 16).

The ions for the implantation of the n-type third layer 3 or the first layer 32 can be phosphorous. The ions can be implanted at an energy between 20 keV up to 200 keV and/or with a dose of $1*10^{13}/cm^2$ up to $1*10^{16}/cm^2$, for example. The anneal step for the activation of the third or first layer 3, 32 can be performed at a temperature of less than 600° C., such as at 400 to 500° C., for example. In case of deposition of n-type pre-doped amorphous silicon, the particles can be deposited with a doping concentration of $1*10^{16}/cm^3$ up to $1*10^{20}/cm^3$, for example.

The third layer 3 may be created with a thickness in a range of 50 nm up to 2 µm, e.g., up to 1 µm, so that the minimum distance 22 between the first and second plane, corresponding at least to the thickness of the third layer 3, also can be in a range 50 nm up to 2 µm, e.g., up to 1 µm.

The p-type second layer 2 may be created by implantation of Boron ions. The ions are implanted at an energy between 20 keV up to 200 keV and/or with a dose of $1*10^{13}/cm^2$ up to $1*10^{16}/cm^2$. Afterwards, the anneal step for the activation of the second layer 2 can be performed at a temperature of at most 500° C. According to an exemplary embodiment, the anneal step can be performed after the first electrical contact 8 is created. Laser anneal can also be performed, which is especially advantageous if the anneal step on the second side is performed after the first electrical contact 8 has been created and the first side shall not be extensively heated up.

In accordance with another exemplary embodiment, the p-type second layer 2 can be made with a higher dose than the dose of the n-type third layer 3. For example, the p-type second layer can be made with a dose of more than $1*10^{14}/cm^2$ as compared to the n-type third layer 3 or the n-type first layer 32, which is made with a dose that is typically one magnitude lower than the dose of the p-type second layer 2. In general, the layer type of the at least one second or third layer 2, 3, which is of a different conductivity type than the base layer 1, can be created with a higher dose than the layer type of the at least one second and third layer 2, 3, which is of the same conductivity type as the base layer 1.

In an alternative arrangement to the third layer 3 or first layer 32 being of n-type and the second layer being of p-type, these conductivity types can be reversed so that the third layer 3 or first layer 32 are of p-type and the second layer 2 can be of n-type. In this case, the method steps as described above can be performed in the same way. In accordance with another exemplary embodiment, the p-type third layer 3 or the p-type first layer 32 can be made with a high dose of more than $1*10^{14}/cm^2$ as compared to the n-type second layer 2, which is made with a dose that is typically one magnitude lower than the dose of the p-type third layer 3. Both layers can then be annealed together with a temperature of at least 900° C. by a laser anneal, for example.

The anneal steps for all exemplary embodiments of methods for manufacturing an RC-IGBT can be left out or they can be performed at any appropriate stage after creation of the corresponding layer. It is also possible to anneal only one layer type (second, third or first layer 2, 3, 32) without annealing the other layers or to perform a combined anneal step for the second and third layers 2, 3 together. The anneal step for the second layer 2 or the combined anneal step for the second and third layer 2, 3 can also be performed simultaneously with the creation of the second electrical contact 9.

It will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

REFERENCE LIST

1 base layer
2 second layer
21 first plane
22 distance
3 third layer
31 second plane
32 first layer
4 fourth layer
41 ninth layer
5 fifth layer
6 sixth layer
61 first electrically insulating layer
62 second electrically insulating layer
7 seventh layer
8 first electrical contact
9 second electrical contact
91 electrically conductive island
10 RC-IGBT
101 emitter side
102 collector side
11 wafer
111 first side
112 second side
12 shadow mask
121 opening
13 buffer layer
14 no snap-back effect 15 weak snap-back effect
16 strong snap-back effect
17 prior art diode snap-off
18 inventive RC-IGBT diode with soft recovery

What is claimed is:

1. A reverse-conducting semiconductor device, comprising:
   a wafer, part of the wafer constituting a base layer which is of a first conductivity type;
   a freewheeling diode arranged on the wafer; and
   a punch-through insulated gate bipolar transistor arranged on the wafer, wherein:
   the insulated gate bipolar transistor comprises an emitter side and a collector side arranged opposite of the emitter side;
   a first electrical contact is arranged on the emitter side, and a second electrical contact is arranged on the collector side;
   at least one third layer of a first or second conductivity type, and at least one second layer of a different conductivity type than the conductivity type of the third layer are arranged on the collector side, the at least one second and third layers being arranged alternately in the insulated gate bipolar transistor;
   a second electrical contact is arranged on the collector side, the second electrical contact being in direct electrical contact with the at least one second and third layers;
   the at least one second layer is arranged in a first plane parallel to the collector side;
   the at least one third layer is arranged in a second plane parallel to the collector side, the second plane being arranged farther from the emitter side than the first plane;
   the first plane and the second plane are spaced from each other by at least a thickness of the at least one third layer;
   a buffer layer of the first conductivity type is arranged between the base layer and the at least one second and third layers,
   wherein none of the at least one second and third layers is an overcompensated layer, and
   wherein the first plane and the second plane are spaced from each other by a distance between 50 nm up to 2 μm.

2. A converter comprising a reverse-conducting semiconductor device according to claim 1.

3. The reverse-conducting semiconductor device according to claim 1, wherein the first plane and the second plane are spaced from each other by a distance up to 1 μm.

4. The reverse-conducting semiconductor device according to claim 1, wherein the at least one of the second and third layers which is of the second conductivity type has a higher doping concentration than the at least one of the second and third layers which is of the first conductivity type.

* * * * *